United States Patent
Hoffman et al.

(10) Patent No.: US 9,300,113 B2
(45) Date of Patent: Mar. 29, 2016

(54) APPARATUS AND METHOD FOR DRIVING MULTIPLE LASERS

(75) Inventors: David Hoffman, Santa Cruz, CA (US); Alexandr Ikriannikov, Castro Valley, CA (US)

(73) Assignee: Versatile Power, Inc., Campbell, CA (US)

( * ) Notice: Subject to any disclaimer, the term of this patent is extended or adjusted under 35 U.S.C. 154(b) by 0 days.

(21) Appl. No.: 13/344,370

(22) Filed: Jan. 5, 2012

(65) Prior Publication Data
US 2012/0189028 A1 Jul. 26, 2012

Related U.S. Application Data

(60) Provisional application No. 61/429,972, filed on Jan. 5, 2011.

(51) Int. Cl.
| H01S 3/00 | (2006.01) |
| H01S 5/042 | (2006.01) |
| H01S 5/40 | (2006.01) |

(52) U.S. Cl.
CPC ............. *H01S 5/0428* (2013.01); *H01S 5/4018* (2013.01)

(58) Field of Classification Search
CPC . H01S 5/0427; H01S 5/0428; H01S 5/06216; H01S 5/06246; H01S 5/4018
USPC ................. 372/29.015, 38.02, 38.07, 29.016, 372/29.023
See application file for complete search history.

(56) References Cited

U.S. PATENT DOCUMENTS

| 4,011,403 | A | 3/1977 | Epstein et al. |
| 5,408,998 | A | 4/1995 | Mersch |
| 5,736,881 | A | 4/1998 | Ortiz |
| 5,748,657 | A | 5/1998 | Gaddis |
| 6,485,414 | B1 | 11/2002 | Neuberger |
| 6,987,787 | B1 | 1/2006 | Mick |
| 7,235,045 | B2 | 6/2007 | Wang et al. |
| 7,723,926 | B2 * | 5/2010 | Mednik .............. H05B 33/0818 315/247 |
| 7,911,151 | B2 * | 3/2011 | Xu ................................ 315/247 |
| 2003/0039280 | A1 * | 2/2003 | Mangano et al. .......... 372/38.02 |
| 2005/0213622 | A1 * | 9/2005 | Diaz ........................... 372/38.02 |
| 2005/0234302 | A1 | 10/2005 | Mackinnon et al. |

(Continued)

FOREIGN PATENT DOCUMENTS

| WO | WO 95/20811 | 8/1995 |
| WO | WO 2005/009086 | 1/2005 |

OTHER PUBLICATIONS

International Search Report and Written Opinion for PCT/US2010/036740, mailed Aug. 10, 2010, 13 pgs.
Tymerski et al., "Generation, Classification and Analysis of Switched-Mode DC-to-DC Converters by the use of Converter Cells", Telecom. Energy Conference Int. IEEE, pp. 181-195, Oct. 1986.

(Continued)

*Primary Examiner* — Tod T Van Roy
(74) *Attorney, Agent, or Firm* — Terrence J. Edwards; TechLaw Ventures, PLLC

(57) ABSTRACT

A laser device includes a plurality of lasers that includes a first laser and a second laser. The laser device further includes a drive circuit configured to apply a pulsed current to the first laser at a first phase. The drive circuit is further configured to apply the pulsed current to the second laser at a second phase. The first phase and the second phase are different. A total voltage provided to the plurality of lasers during a period between the first and second phases is substantially smaller than a sum of individual voltages provided to the plurality of lasers, respectively, during a pulse period of the pulsed current.

18 Claims, 9 Drawing Sheets

(56) References Cited

U.S. PATENT DOCUMENTS

| | | |
|---|---|---|
| 2005/0276291 A1 | 12/2005 | Nishimura |
| 2006/0098699 A1* | 5/2006 | Sanchez .......................... 372/26 |
| 2006/0291512 A1* | 12/2006 | Borschowa ................ 372/38.02 |
| 2009/0054957 A1 | 2/2009 | Shanbaky |
| 2010/0228089 A1 | 9/2010 | Hoffman et al. |
| 2010/0265467 A1* | 10/2010 | Lescure et al. .................. 353/20 |
| 2012/0223649 A1* | 9/2012 | Saes et al. ..................... 315/186 |

OTHER PUBLICATIONS

Wong et al., "Tip of the week: How to best implement a synchronous buck converter"; EE Times design article (first paragraph), Apr. 26, 2008.

Microchip Inc., "Buck converter design example"; Microchip Web Seminar, 2006 (note slide 13).

\* cited by examiner

APPARATUS AND METHOD FOR DRIVING MULTIPLE LASERS

CROSS REFERENCE TO RELATED APPLICATIONS

This application claims the benefit from U.S. Provisional Application No. 61/429,972 filed on Jan. 5, 2011, which is hereby incorporated by reference for all purposes as if fully set forth herein.

This application is related to U.S. application Ser. No. 12/487,591 filed on Jun. 18, 2009, which was owned by or subject to an obligation of assignment to the Assignee of this application at the time of the invention thereof was made. This related application was published on Sep. 9, 2010 as U.S. PG Pub. No. 2010/0228090, the contents of which is hereby incorporated hereto by reference for all purposes as if fully set forth herein.

BACKGROUND

1. Field

This invention is directed to an apparatus and method for driving solid state lasers and, more particularly to, an apparatus and method for pulsing current to the lasers connected in series at different phases.

2. Description of the Related Art

A laser is a device that emits light (electromagnetic radiation) through a process of optical amplification based on the stimulated emission of photons. Semiconductor lasers are solid state devices (e.g., diodes), in which recombination of electrons and holes created by current applied thereto introduces optical gain. Laser diodes are widely used in various industries, such as, e.g., measuring instruments, barcode readers, laser pointers, scanners, optical device players, laser absorption spectrometry (LAS), welding, medical procedures (e.g., endoscopy), and the like.

SUMMARY

According to an embodiment of the invention, a laser device includes a plurality of lasers that includes a first laser and a second laser. The laser device further includes a drive circuit configured to apply a pulsed current to the first laser at a first phase and apply the pulsed current to the second laser at a second phase. The first phase and the second phase are different. A total voltage provided to the plurality of lasers during a period between the first and second phases is substantially smaller than a sum of individual voltages provided to the plurality of lasers, respectively, during a pulse period of the pulsed current.

According to another embodiment of the invention, a method of driving a plurality of lasers includes providing a pulsed current to a first laser at a first phase. The pulsed current is provided to a second laser at a second phase. The first phase and the second phase are different. A total voltage provided to the plurality of lasers during a period between the first and second phases is substantially smaller than a sum of individual voltages provided to the plurality of lasers, respectively, during a pulse period of the pulsed current.

According to certain embodiments, a non-transitory computer readable storage medium has a stored computer program embodying instructions, which, when executed by a computer, cause the computer to drive a plurality of lasers. The computer readable medium includes instructions for providing a pulsed current to a first laser at a first phase. The computer readable medium further includes instructions for providing the pulsed current to a second laser at a second phase. The first phase and the second phase are different. A total voltage provided to the plurality of lasers during a period between the first and second phases is substantially smaller than a sum of individual voltages provided to the plurality of lasers, respectively, during a pulse period of the pulsed current.

Additional features, advantages, and embodiments of the invention may be set forth or apparent from consideration of the following detailed description, drawings, and claims. Moreover, it is to be understood that both the foregoing summary and the following detailed description are exemplary and intended to provide further explanation without limiting the scope of the invention as claimed.

BRIEF DESCRIPTION OF THE DRAWINGS

For proper understanding of the invention, reference should be made to the accompanying drawings, wherein.

DETAILED DESCRIPTION

Figure 1A:
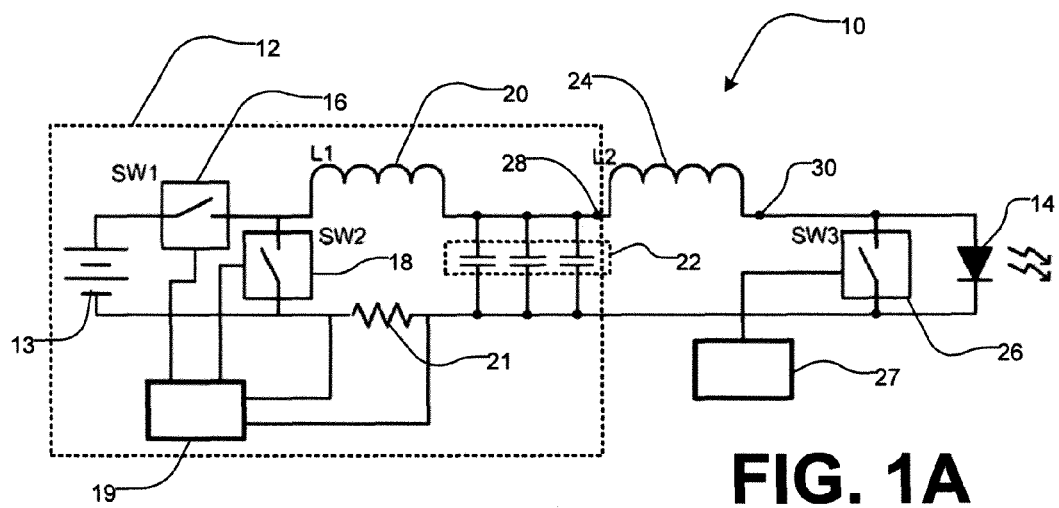
FIG. 1A illustrates a laser drive circuit according to an embodiment of the invention.

The examples used herein are intended merely to facilitate an understanding of ways in which the invention may be practiced and to further enable those who are skilled in the art to practice the embodiments of the invention. Accordingly, the examples and embodiments herein should not be construed as limiting the scope of the invention. Moreover, it is noted that like reference numerals represent similar parts throughout the several views of the drawings.

FIG. 1A illustrates a laser drive circuit 10, which is constructed according to an embodiment of the invention. The laser drive circuit 10 includes a laser 14 and a buck converter 12 that provides a current to the laser 14. The laser 14 may be a solid state laser, e.g., laser diode or the like. The buck converter 12 includes a DC power source 13, a series switch (SW1) 16, a parallel switch (SW2) 18, a buck inductor (L1) 20, and output capacitors 22. The DC power source 13 may be connected to the series switch 16, parallel switch 18, buck inductor 20, and output capacitors 22.

The series switch 16 and the parallel switch 18 may operate to alternately provide the current from the DC power source 13 to the buck inductor 20. The buck inductor 20 may store energy from the DC power source 13 during a buck-on state, for example, when the series switch 16 is closed and the parallel switch 18 is open, and discharges the stored energy during a buck-off state, for example, when the series switch 16 is open and the parallel switch 18 is closed. The inductance value of the buck inductor 20 may be selected to generate large AC current ripple for reliable current mode control. For example, an inductance value of the buck inductor 20 may be about 1 μh. The output capacitors 22 may be provided to absorb the AC current ripple from the buck inductor 20.

The laser drive circuit 10 may further include a current controller 19 and a sense resistor 21. The current controller 19 may alternately activate and deactivate the series switch 16 and the parallel switches 18 to control the level of the current from the buck inductor 20, which is herein referred to as buck current. The current controller 19 may carry out a current mode control scheme, such as, e.g., peak current mode control scheme, average current mode control scheme, or the like, to control the buck current. The sense resistor 21 may be coupled between the parallel switch 18 and the output capacitors 22 to provide a feedback signal to the current controller 19 for accurate adjustment of the buck current.

Other topologies are also contemplated for current source of the laser drive circuit 10 instead of the buck converter 12. For example, according to the embodiments of the invention, a boost converter, a full bridge converter with transformer isolation, or the like, may be used depending on, e.g., application requirements, available input power source, and the like. Implementing current mode in such topologies may effectively render them to operate as a current source, which provides a preset current to the output inductor 24.

An output switch (SW3) 26, which is also known as a chopper, may be connected to the laser 14 in parallel, and may be used to pulse the current from the buck converter 12 to the laser 14. When the output switch 26 is activated, turned on or closed, the laser 14 may be shunted, which may effectively ensure zero current flowing to the laser 14. The output switch 26 may allow pulsing the current to the laser 14 virtually at any frequency and any pulse width, i.e., duty cycle. A user input to the controller 19 may allow a user to adjust the value of the current delivered by the buck converter 12, which may affect the light intensity or color of the system output, by changing the light output from the particular laser. A user input to the controller 27 may allow a user to adjust the light intensity or color, or both, by causing a change in duty cycle or pulse frequency, or both, of the current provided to the laser 14.

An output inductor (L2) 24 may be connected to an output node 28 of the buck converter 12 to minimize the AC current ripple in the current provided to the laser 14. The output inductor 24 may also be connected to the output switch 26 and the laser 14 at a node 30. The output inductor 24 may have a relatively large inductance value, for example, about 10 μh, to minimize the AC current ripple in the current output from the output inductor 24, which is herein referred to as output current, even when the buck current from the buck converter 12 is periodically shorted or shunted by the output switch 26. The output inductor 24 may also prevent discharging of the voltage across the output capacitors 22 by the output switch 26. Preventing discharge of the output capacitors 22 on each activation of the output switch 26 may also improve efficiency of the laser drive circuit 10. The sense resistor 21 may be connected to the buck inductor 20 in series, and the current applied to the buck inductor 20 may be controlled by varying the resistance value of the sense resistor 21 or a reference signal to the controller 19 to adjust the amount of current flowing through the sense resistor 21.

The laser drive circuit 10 may further include a switch controller 27, such as, e.g., pulse-width modulation (PWM) controller, or the like, which may be operatively connected to the output switch 26. The switch controller 27 may be configured to control a switching frequency, at which the output switch 26 is turned on and turned off, and to control a switching time duration, for which the output switch 26 stays turned on or off. The switching frequency may correspond to a frequency of the pulsed current provided to the laser 14. The switching time duration may correspond to a duty cycle of the pulsed current provided to the laser 14.

Figure 1B:
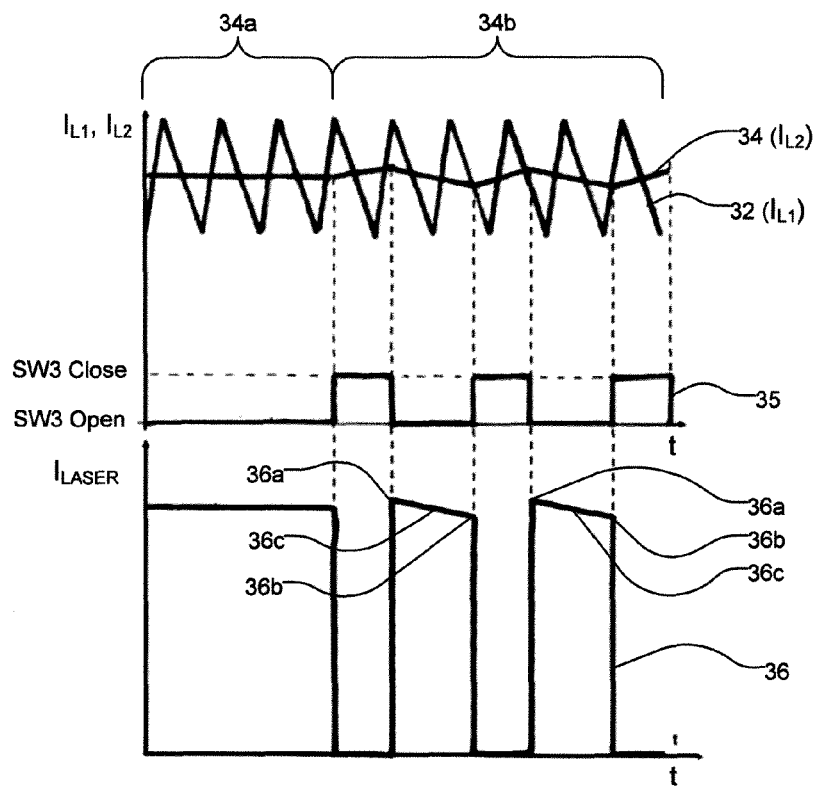
FIG. 1B illustrates a waveform diagram of currents at various nodes of the laser drive circuit of FIG. 1A, and an open/close status of an output switch of the laser drive circuit of FIG. 1A according to an embodiment of the invention.

FIG. 1B illustrates a waveform diagram of the currents at various nodes of the laser drive circuit 10 along with the open/close status of the output switch 26 according to an embodiment of the invention. In FIG. 1B, a waveform 32 ($I_{L1}$) represents the buck current, and a waveform 34 ($I_{L2}$) represents the output current. A waveform 35 represents the open/close state of the output switch (SW3) 26. A waveform 36 represents a pulsed current $I_{LASER}$ provided to the laser 14 by the closing and opening of the output switch 26.

Compared to the large current ripple present in the buck current $I_{L1}$, the output current $I_{L2}$ may have no current ripple when, for example, the output switch 26 is continuously turned off or open, or very small current ripple when, for example, the output switch 26 is repeatedly turned on and off, as the result of the laser voltage being periodically shorted by the output switch 26. The laser current $I_{LASER}$ may be initially constant with no ripple, which corresponds to the waveform segment 34a of the output current $I_{L2}$, and then pulsed with very little ripple, which corresponds to the segment 34b of the output current $I_{L2}$. Thus, the laser drive circuit 10 may be capable of generating large current ripple in the buck current $I_{L1}$ and small current ripple in the output current $I_{L2}$, which is desirable for driving a single laser.

Figure 1C:
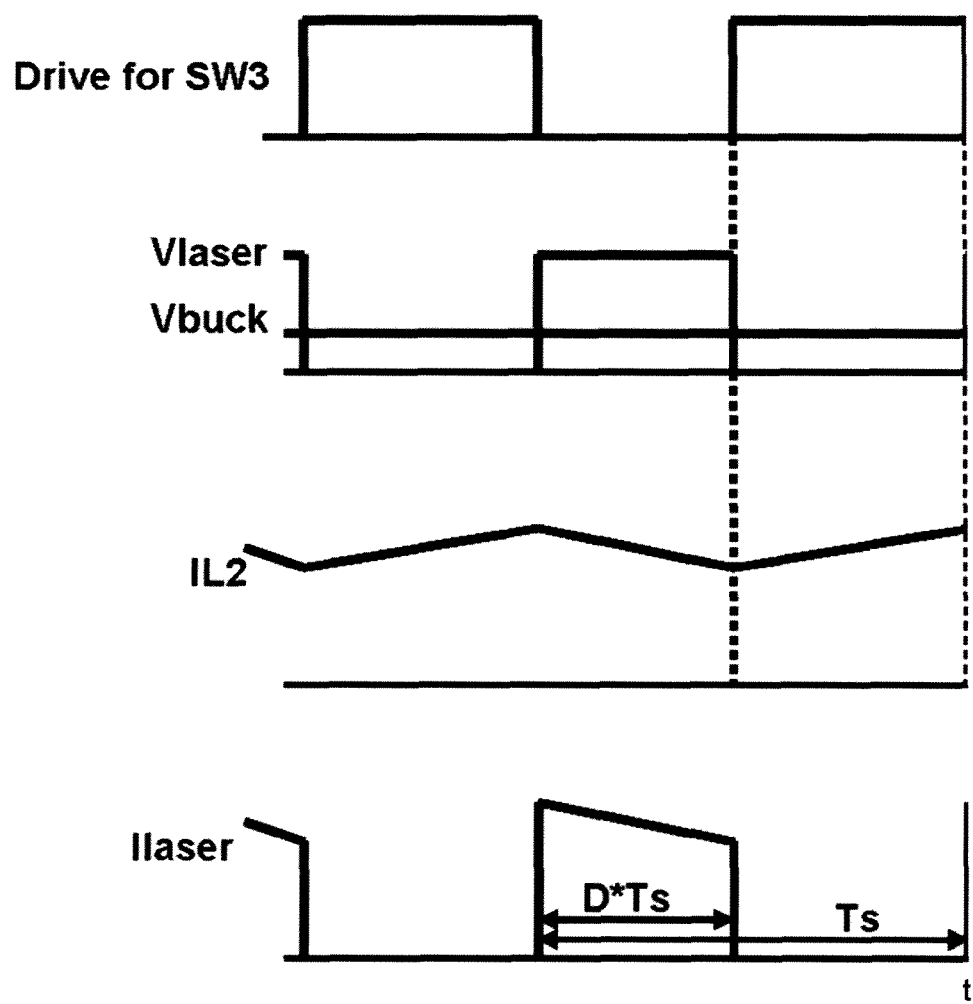
FIG. 1C illustrates a waveform diagram of a control signal for the output switch, and currents and voltages at various nodes of the laser drive circuit of FIG. 1A according to an embodiment of the invention.

FIG. 1C illustrates a waveform diagram of the control signal for the output switch 26, a buck voltage $V_{buck}$, a laser voltage $V_{laser}$, the output current $I_{L2}$, and the laser current $I_{LASER}$. Assuming that the laser current $I_{LASER}$ is pulsed at a frequency Fs, a period Ts of each pulse may be calculated from the following equation.

$$Ts = 1/Fs$$

When the current $I_{LASER}$ is pulsed at a controlled duty cycle D, the laser 14 may conduct the current $I_{LASER}$ for a time period, which can be calculated from multiplying the duty cycle D and the pulse period Ts. The current ripple $\Delta I_{L2}$ in the output current $I_{L2}$ may be calculated from the following equation.

$$\Delta I_{L2} = \frac{Vbuck}{L2}(1-D)Ts = \frac{Vlaser - Vbuck}{L2}DTs$$

In an embodiment of the invention, a single laser that is six times larger may be used in order to increase a light source power. However, this may significantly decrease yield because larger semiconductor products are more prone to manufacturing errors and defects. Also, the dramatically increased laser power in a small volume may complicate thermal solutions and affect product reliability.

In another embodiment of the invention, multiple lasers with the same wavelength may be connected together to increase the light source power. For an RGB solution, multiple red lasers, multiple green lasers, and multiple blue lasers may be collectively used to create a white light source. A dedicated drive circuit may be provided for the lasers with the same wave length. Thus, the RGB solution may require only three drive circuits (one per each color). The lasers with different wavelengths may be controlled differently to increase light source performances, to maximize light source efficiency, and to optimize light balance/mixture.

Figure 2:
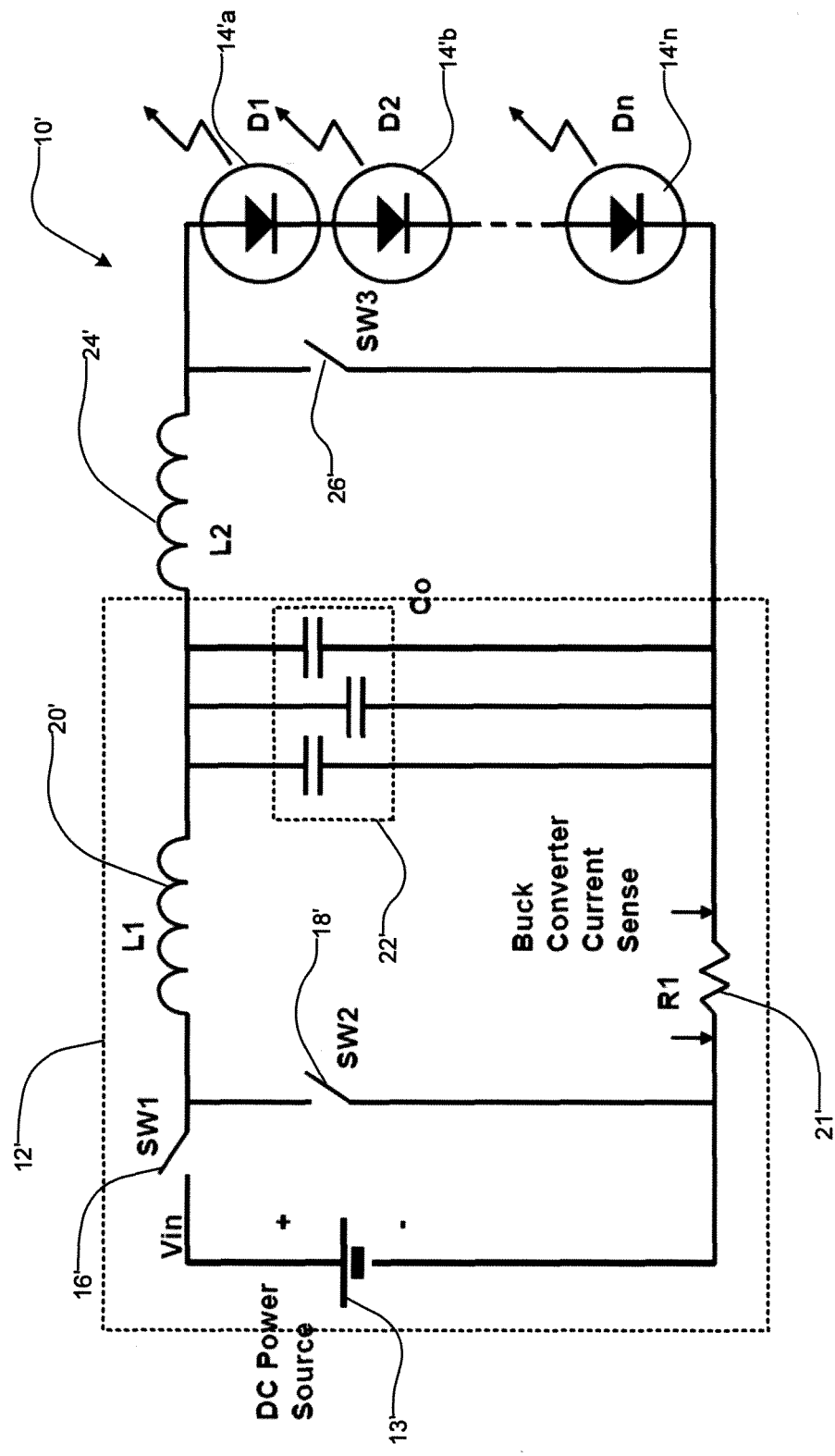
FIG. 2 illustrates a laser drive circuit according to another embodiment of the invention.

For example, FIG. 2 illustrates a circuit diagram of a laser driving circuit 10' for driving multiple lasers 14's, which is constructed according to an embodiment of the invention. The laser driving circuit 10' may include an N number of lasers 14', for example, lasers 14'a, 14'b, . . . , 14'n, which may have the same wavelength and may be connected in series, to produce the N times the output of a laser drive circuit with a single laser, for example, laser drive circuit 10 shown in FIG. 1A. The construction of the laser driving circuit 10' may be similar to the laser driving circuit 10 shown in FIG. 1A, with the exception of the N number of lasers 14 that are connected in series, which may require N times the voltage required for the single laser.

For example, the laser drive circuit 10' may include a buck converter 12', an output inductor 24', an output switch 26', the lasers 14', and/or the like. The buck converter 12' may include a power source 13', a serial switch 16', a parallel switch 18', a buck inductor 20', a sense resistor 21', output capacitors 22', and/or the like, which may be arranged and interconnected in a similar manner to the laser drive circuits 10 shown in FIG. 1A. The laser drive circuit 10' may further include a controller (not shown), which may be similar to the controller 19 shown in FIG. 1A, for controlling the serial switch 16' and the parallel switch 18'. The laser drive circuit 10' may also include a switch controller (not shown), which may be similar to the switch controller 27 shown in FIG. 1A, for controlling the output switch 26'. Other constructions are also contemplated for the laser driving circuit 10'. For example, other topologies may be used as the current source of the laser drive circuit 10' instead of the buck converter 12'.

The laser drive circuit 10' may pulse the current to the lasers 14' simultaneously, which is herein referred to as simultaneous current pulsing. In the laser drive circuit 10' performing the simultaneous current pulsing operation, the current ripple $\Delta In_{L2}$ in the output current from the output inductor 24' may be calculated from the following equation. Here Vbuck is the voltage of the laser drive circuit having a single laser load shown in FIG. 1A, and multiplier N indicates that it will be increased N times in case when N lasers are connected in series. Correspondingly, Vlaser is a voltage across a single laser, and the multiplier N shows that the total voltage in the series connection of N lasers may be N times larger.

$$\Delta In_{L2} = \frac{Vbuck \cdot N}{L2}(1-D)Ts = \frac{Vlaser \cdot N - Vbuck \cdot N}{L2}DTs = N \cdot \Delta I_{L2}$$

Here, $\Delta I_{L2}$ is a current ripple value in an output current of a laser drive circuit with a single laser, for example, laser drive circuit 10 shown in FIG. 1A. Since the current ripple $\Delta I_{L2}$ is directly proportional to the voltage applied across the output inductor 24', when the N number of lasers 14' are connected in series, all voltages in the laser drive circuit 10' may also be scaled up by N times. The single output switch 26' handles the entire voltage applied to the entire lasers 14', which may swing between zero and the maximum voltage that may equal the single laser voltage multiplied by the number of the lasers 14'.

In an embodiment, the output current may be regulated to a desired value although the AC current ripple in the output current may still be N times greater as compared to a single laser situation. Thus, in an embodiment, an inductor having an N times larger inductance value may be used for the output inductor 24' to reduce the current ripple in the output current in an embodiment, which may result in substantial increase in device size and manufacturing cost. Nevertheless, the simultaneous current pulsing may still be beneficial because it is possible to drive multiple lasers with a single laser driver while adjusting desired color balance/mixture.

While the output current ripple in the output inductor 24 in FIG. 1A and the output current ripple in the output inductor 24' in FIG. 2 may be the same given that the output inductor 24' in FIG. 2 is N times larger than the output inductor 24 in FIG. 1A, the laser drive circuit 10' shown in FIG. 2 may perform worse than the laser drive circuit 10 shown in FIG. 1A due to slower switching transitions in the laser drive circuit 10'. When the single switch 26' in FIG. 2 shorts and un-shorts the N number of lasers 14 connected in series, the current may switch between the single switch 26' and the serial connection of the N number of lasers 14 with a relatively large total stray inductance. Since the N number of lasers 14 would typically be used in individual packages for thermal reasons, connections between these packages may add a substantial amount of parasitic stray inductance, which may limit the current slew rate for the switching transitions.

Figure 3A:
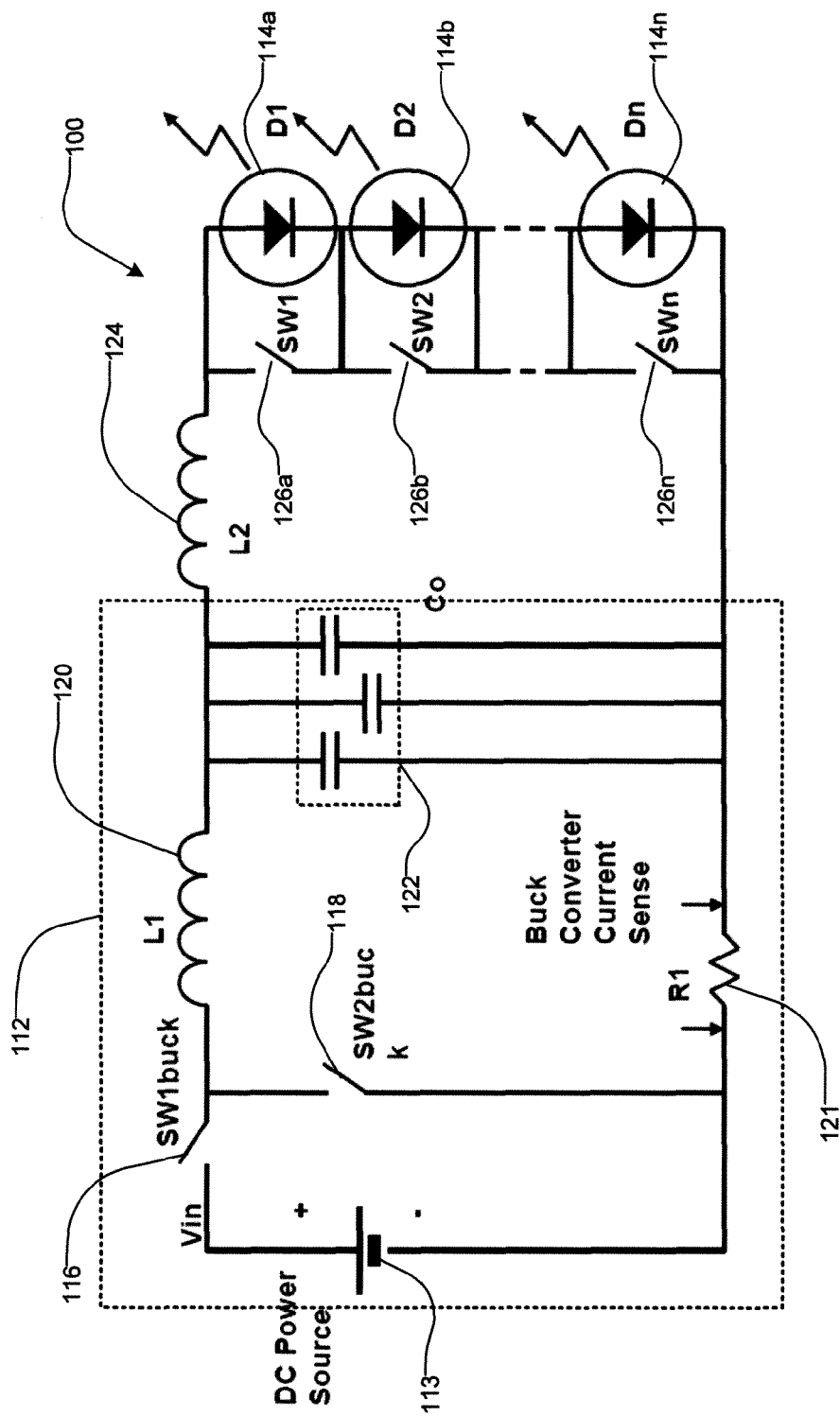
FIG. 3A illustrates a laser drive circuit according to another embodiment of the invention.

According to an embodiment of the invention, the N number of individual switches may be implemented for the N number of lasers connected in series, as shown in FIG. 3A. Each switch may be implemented across a corresponding laser, which may effectively exclude the stray inductance of the serial connection of the lasers from the current switching. The excluded parts of the stray inductance may be effectively added to the output inductor in series and may not limit the current slew rate when the switches are turned on and off. Thus, the switching transitions for all of the lasers connected in series may become as fast as the switching transitions for a single laser driving scheme shown in FIG. 1A. Furthermore, when one or more laser fail or malfunction, the switches corresponding thereto may be used to permanently short the malfunctioning lasers.

As noted above, using N lasers in series in the circuit in FIG. 2 may significantly slow down and degrade switching transitions due to the increased stray inductance. The degraded switching transitions due to the increased stray inductance may also decrease the system efficiency, as the energy stored in the total stray inductance of the N laser connection may dissipate when the output switch 26' is closed. Therefore, the laser drive circuit 100 in FIG. 3 may provide faster switching transitions for the multiple lasers in series and may be more efficient than the laser drive circuit 10' in FIG. 2.

According to another embodiment of the invention, multiple lasers may be pulsed at different phases to reduce the voltages in a laser drive circuit, which is herein referred to as phased current pulsing. For example, FIG. 3A illustrates a circuit diagram of a laser drive circuit 100 for driving an N number of lasers 114, for example, lasers 114a, 114b, . . . , 114n, which is constructed according to another embodiment of the invention.

The laser drive circuit 100 may be constructed similarly to the laser drive circuit 10' with the exception of a plurality of output switches 126, for example, output switches 126a, 126b, . . . , 126n, which are operationally connected to and individually control the lasers 114, respectively. For example, the laser drive circuit 100 may include a buck converter 112, an output inductor 124, the output switches 126, the lasers 114, and/or the like. The buck converter 112 may include a power source 113, a serial switch 116 (SW1buck), a parallel switch 118 (SW2buck), a buck inductor 120, a sense resistor 121, output capacitors 122, and/or the like, which may be arranged and interconnected in a similar manner to the laser drive circuit 10' shown in FIG. 2. Other topologies are also contemplated for the current source of the laser driver circuit 100, as noted above. The laser drive circuit 100 may further include a controller (not shown), which may be similar to the controller 19 shown in FIG. 1A, for controlling the serial switch 116 and the parallel switch 118. The laser drive circuit 100 may also include one or more switch controllers (not shown), which may be similar to the switch controller 27 shown in FIG. 1A, to control the output switches 126 individually. Other constructions are also contemplated for the laser drive circuit 100.

Figure 3B:
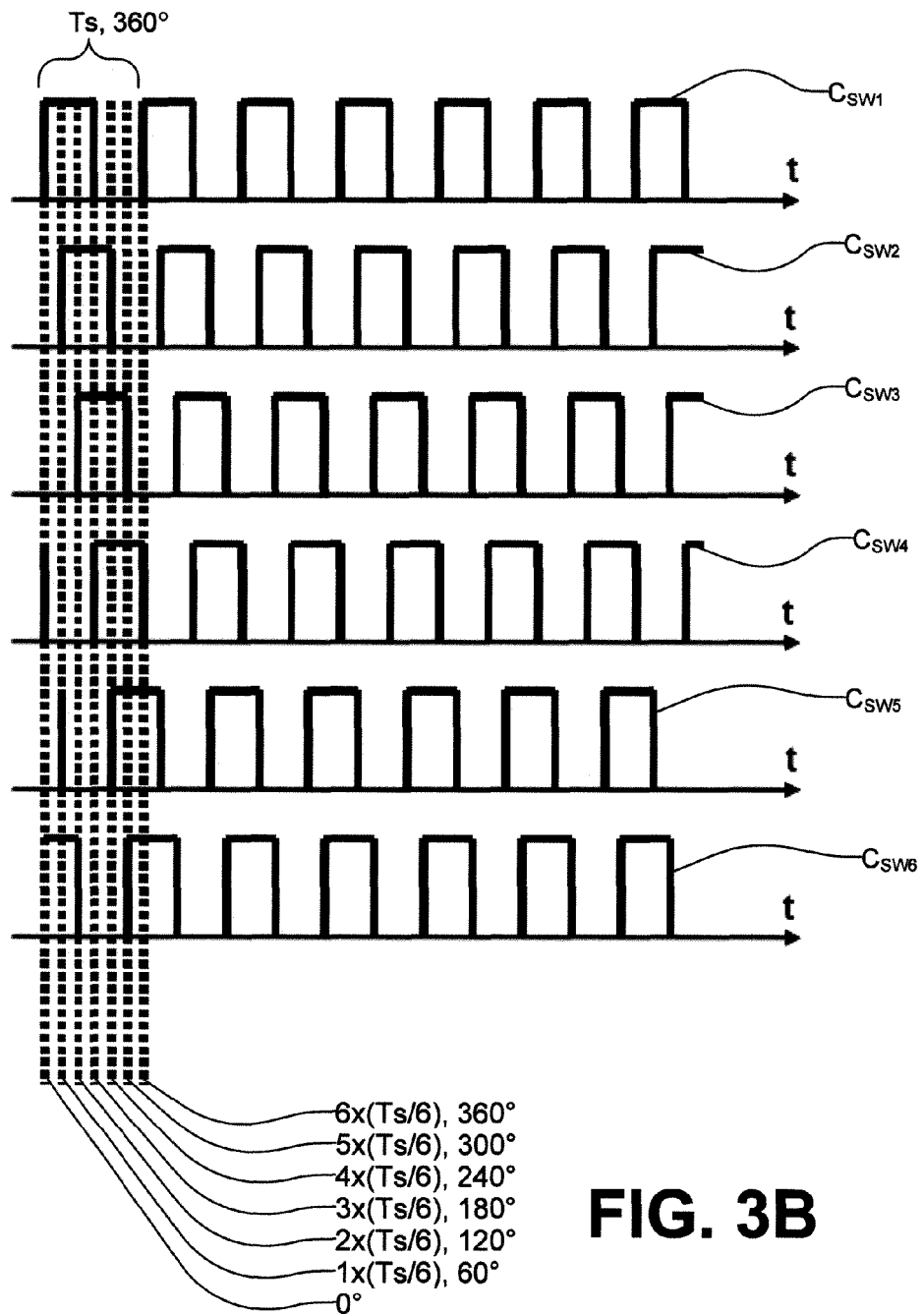
FIG. 3B illustrates a waveform diagram of a plurality of control signals for a plurality of output switches of the laser drive circuit of FIG. 3A according to an embodiment of the invention.

In an embodiment, the output switches 126 may pulse the output current to the lasers 114 in a uniformly phased manner in a time domain. In an embodiment, the phase difference may be determined by dividing the pulse period Ts by the number of the lasers 114. For example, when the pulse period is 360 degrees, two lasers 114 may be pulsed with a 180 degree phase difference, three lasers 114 may be pulsed with a 120 degree phase difference, and four lasers 114 may be pulsed with a 90 degree phase difference. More than four lasers 114 may also be pulsed at difference phases. For example, FIG. 3B illustrates a waveform diagram of six switch control signals $C_{SW1}$, $C_{SW2}$, $C_{SW3}$, $C_{SW4}$, $C_{SW5}$, and $C_{SW6}$ applied to six output switches 126a, 126b, 126c, 126d, 126e, and 126f, respectively, to pulse six different lasers 114 with a Ts/6 degree phase difference. When the pulse period is 360 degrees, the phase different would be 60 degrees. The phase for each laser 114 may be shifted by 60 degrees from the previous laser 114, for example, 0°, 60°, 120°, 180°, 240° and 300°. Regardless of how many lasers 114 are connected in series, the lasers 114 may still have the same duty cycle while operating at different phases.

By pulsing the current to the lasers 114 at different phases, the total voltage applied to the entire lasers 114 may be averaged out and lowered during each period between two consecutive phases. Also, the AC amplitude of the total voltage applied to the entire lasers 114 may be substantially reduced.

For example, in FIG. 3B, during the first period between 0 degree, i.e., first phase, and 60 degrees, i.e., second phase, of the pulse period Ts, the control signals $C_{SW1}$, $C_{SW5}$, and $C_{SW6}$ may stay at a high level to turn on the switches 126a, 126e, and 126f. The control signals $C_{SW2}$, $C_{SW3}$, and $C_{SW4}$ for the switches 126b, 126c, and 126d may stay at a low level. Thus, only the lasers 114b, 114c, and 114d may be pulsed, and the lasers 114a, 114e and 114f may be shunted during the first period. In the next period, i.e., second period, between 60 degrees and 120 degrees, the control signals $C_{SW3}$, $C_{SW4}$ and $C_{SW5}$ may stay at the low level, and the pulsed current may be provided only to the lasers 114c, 114d, and 114e during the second period. In the sixth period between 300 degrees and 360 degrees, the control signals $C_{SW1}$, $C_{SW2}$, and $C_{SW3}$ may stay at the low level, and only the lasers 114a, 114b and 114c may be provided with the pulsed current in the sixth period. Thus, during each period, the total laser voltage applied to the string of the lasers 114 may be substantially smaller than a sum of individual laser voltages applied to the lasers 114, respectively, during the pulse period of the pulsed current.

In the embodiment shown in FIGS. 3A and 3B, the voltage applied to each of the lasers 114 may be shorted to zero at different times. In particular, FIG. 3B shows that only a half of the lasers 114 or so are powered with the pulsed current at each period. Since the total voltage applied to the lasers 114 is a sum of individually pulsed voltages, the total laser voltage may be averaged out and substantially lowered. As the total laser voltage is averaged and has significantly reduced AC ripple, the AC current ripple may also be significantly reduced in the output current from the output inductor 124. This may be due to the fact that a significantly smaller AC voltage is applied to the output inductor 124 with substantially constant voltage on the output capacitors 122 on one side and a total laser voltage with substantially reduced AC ripple on another. This may leads to proportional reduction of the AC currents in the output inductor 120. The reduced AC amplitude of the total laser voltage and multiplication of the frequency of the voltage ripple by a factor of N due to phasing of the pulses across the N lasers may contribute to reducing the current ripple in the output current because current ripple is proportional to the voltage across the output inductor 124 and the time interval of the applied voltage, as mentioned above.

Other phasing/timing methods are also contemplated. For example, in another embodiment, when a large number of the lasers 114 are connected in series, the lasers 114 may be pulsed randomly at the same frequency to average out the total laser voltage and to reduce the AC current ripple in the output current. Also, in another embodiment, the phased current pulsing operation may be completely randomized to operate at, e.g., different frequencies, phases, duty cycles, and the like. The randomized phased current pulsing would still lead to the benefits of reduced current ripple as the total laser voltage would be averaged out and reduced. More lasers connected in series may lead to even more reduction in total laser voltage and current ripple in the output inductor.

Figure 4A:
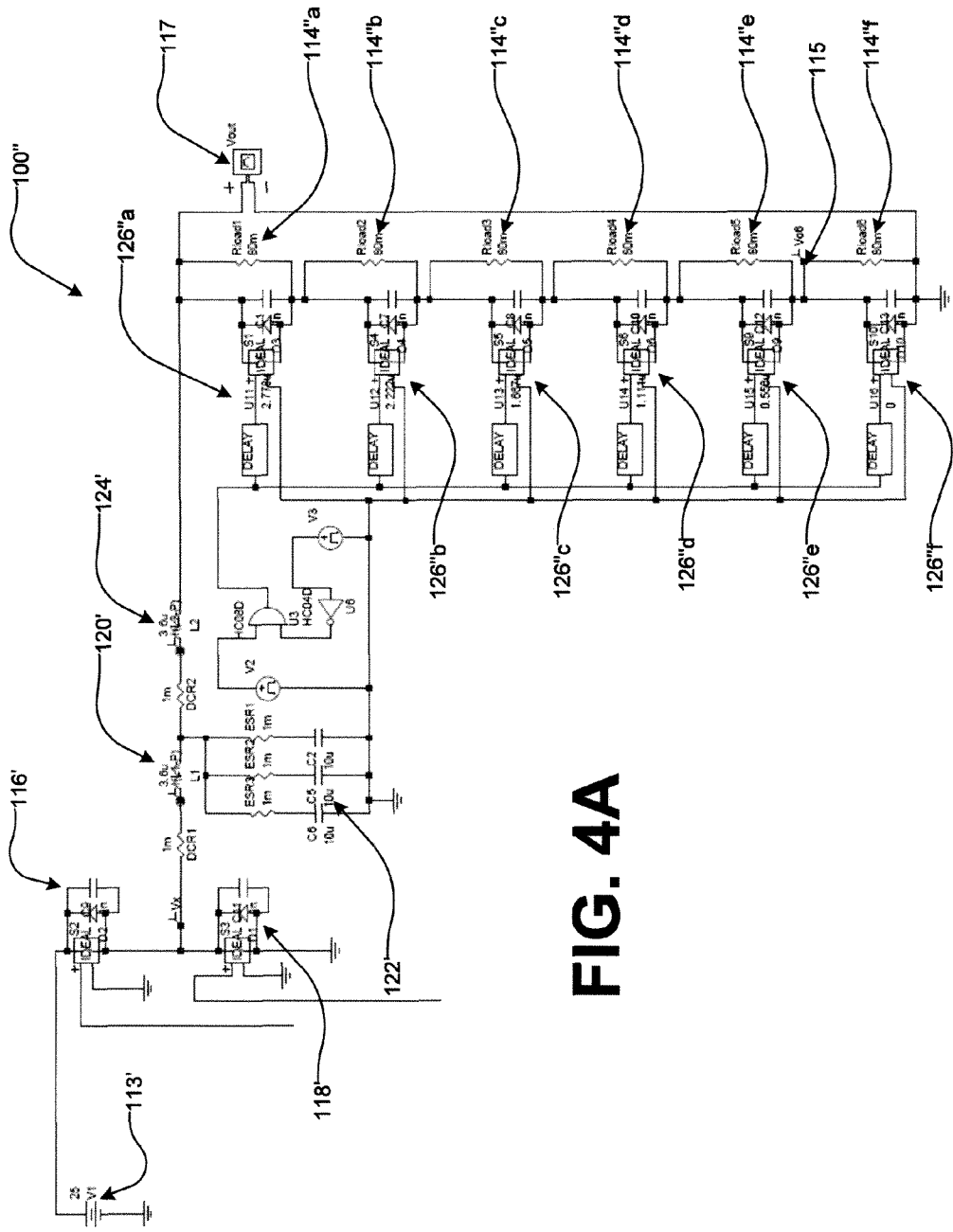
FIG. 4A illustrates another embodiment of a laser drive circuit.

FIG. 4A illustrates an open loop circuit 100', which is configured to simulate the simultaneous current pulsing operation and the phased current pulsing operation, which is constructed according to another embodiment of the invention. This is shown as a mere example, and the control scheme for the multiple switches 126" may be implemented in various ways. The laser drive circuit 100' may include a power source 113', a serial switch 116', a parallel switch 118', a buck inductor 120', output capacitors 122', an output inductor 124', six output switches 126", for example, output switches 126"a, 126"b, 126"c, 126"d, 126"e, and 126"f, six lasers 114", for example, lasers 114"a, 114"b, 114"c, 114"d, 114"e, and 114"f. Other constructions are also contemplated for the circuit 100'.

To emulate the single output switch 26 of the laser drive circuit 10' shown in FIG. 2, the output switches 126" may be controlled to pulse simultaneously. The output switches 126" may also be controlled to pulse at different phases to emulate the output switches 126 of the laser drive circuit 100 shown in FIG. 3A. For the simulation purposes, a voltage V1 from the power source 113' may be about 25V. Both inductance values of the buck inductor 120' and the output inductor 124' may be about 3.6 µH. The switches 116', 118' of the buck converter may be pulsed at a frequency Fs of about 130 KHz. Each of the output switch 126" may be controlled by a single 300 KHz signal at 40% duty cycle (i.e., 40% of the current is pulsed to the corresponding laser 114).

Figure 4B:
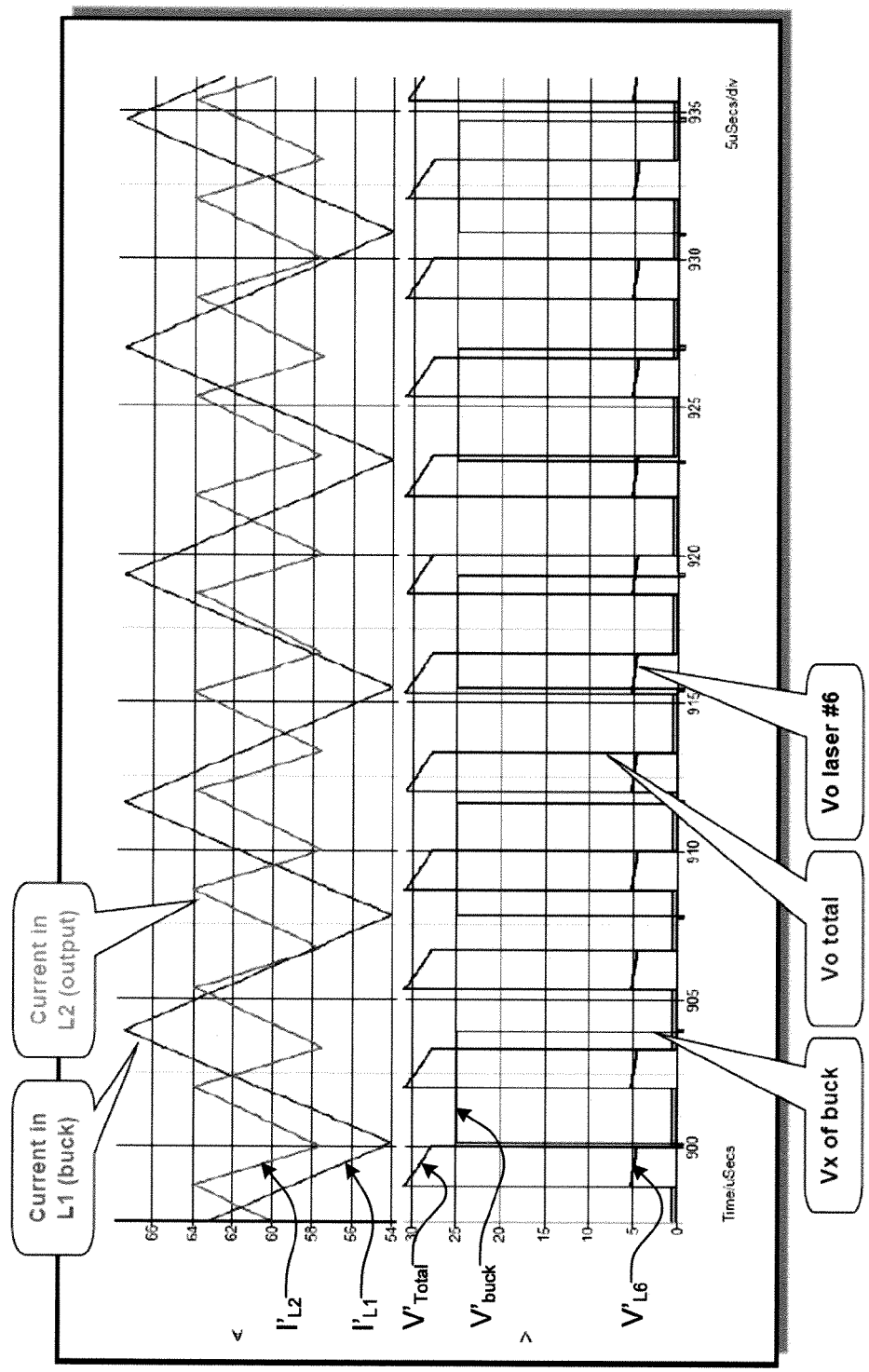
FIG. 4B illustrates a waveform diagram of various currents and voltages of the laser drive circuit of FIG. 4A according to an embodiment of the invention.
Figure 4C:
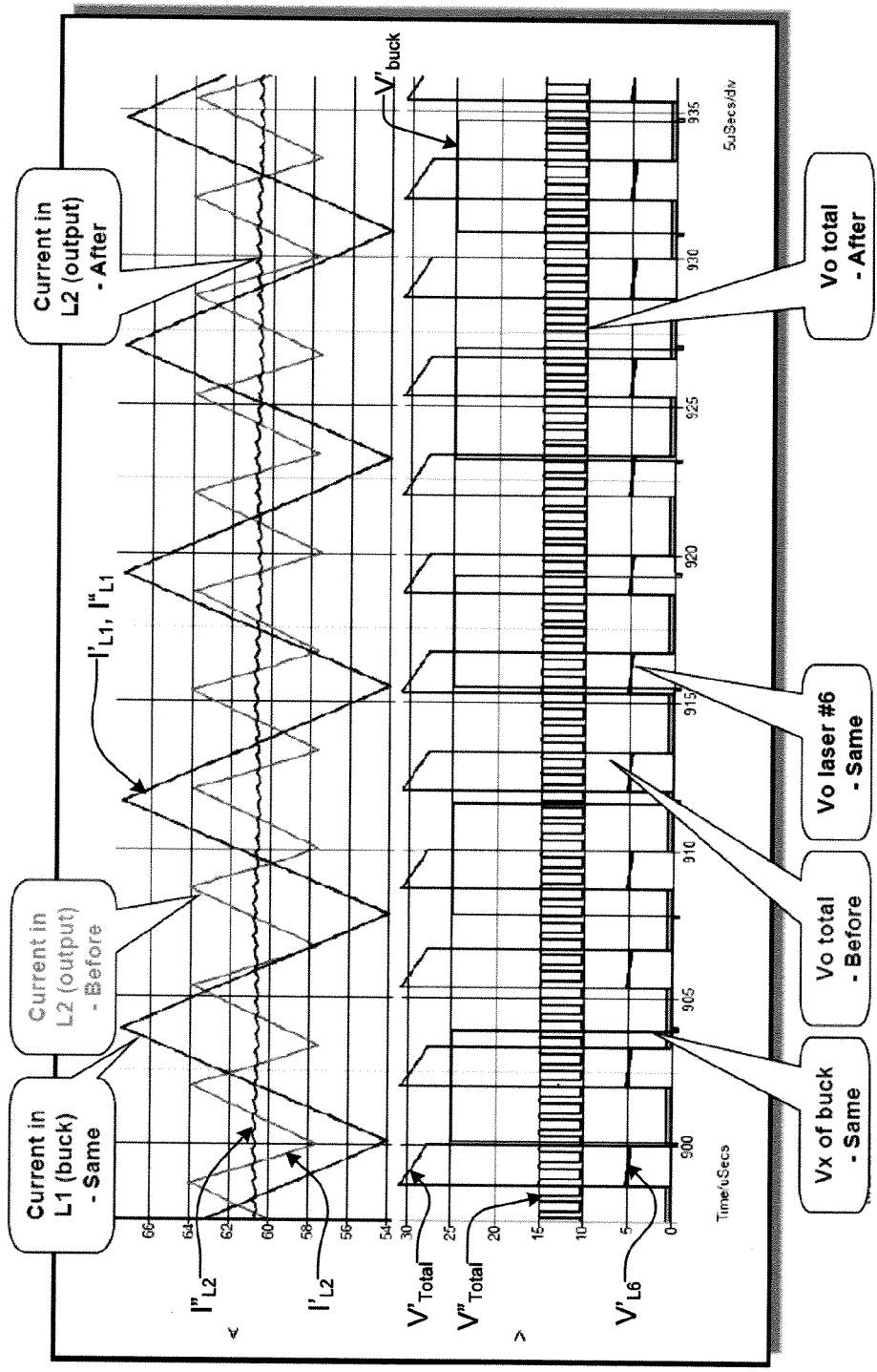
FIG. 4C illustrates a waveform diagram of various currents and voltages of the laser drive circuit of FIG. 4A according to an embodiment of the invention.
Figure 4D:
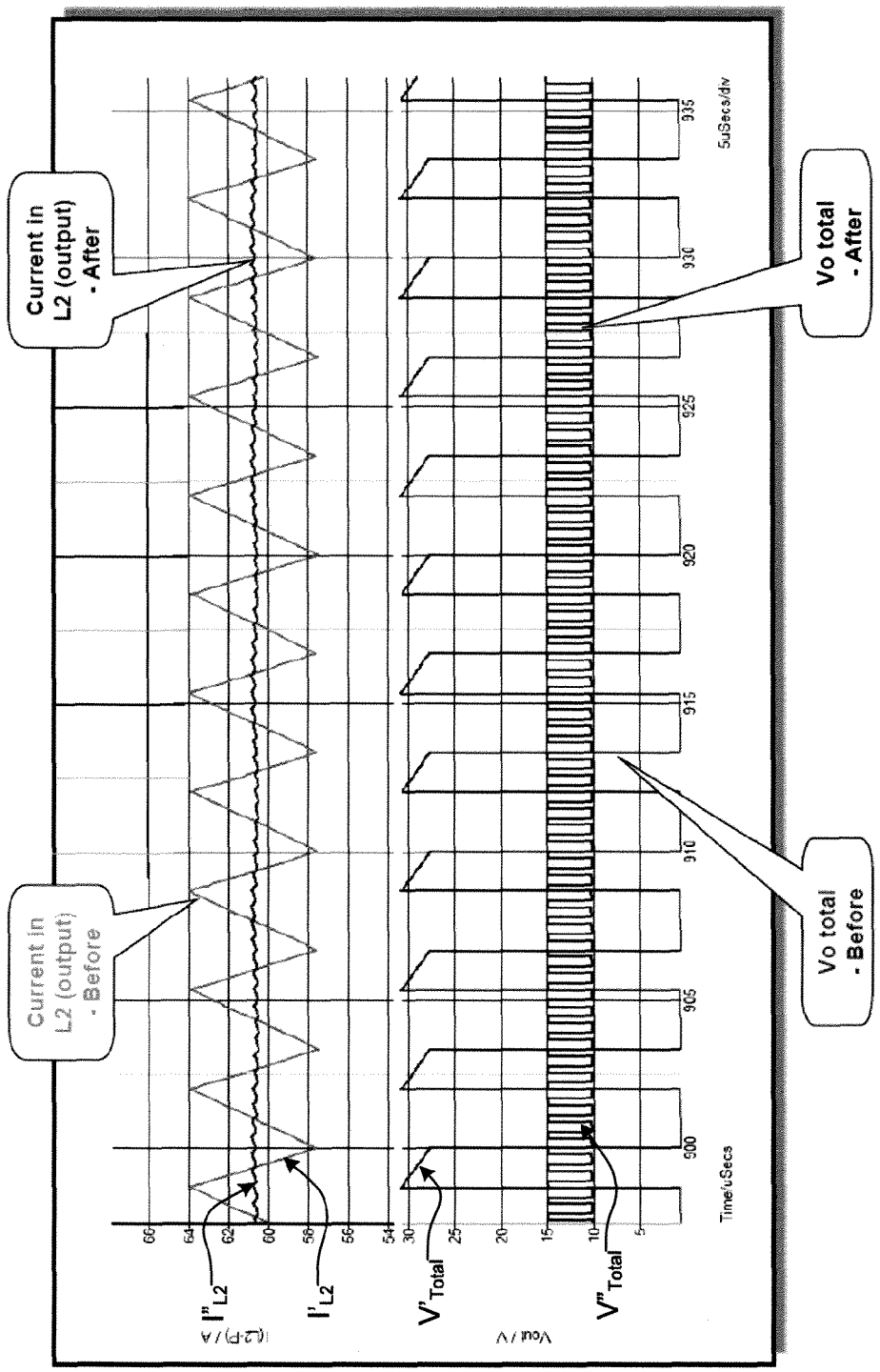
FIG. 4D illustrates a waveform diagram of output inductor currents and total laser voltages of the laser drive circuit of FIG. 4A according to an embodiment of the invention.

FIGS. 4B, 4C and 4D illustrate the simulation results of the simultaneous current pulsing and phased current pulsing operations using the open loop circuit 100'. FIG. 4B shows the simulation result from the simultaneous current pulsing operation, in which the output switches 126" are controlled to pulse the current simultaneously to the lasers 114. A waveform $I'_{L1}$ represents a buck current from the buck inductor 120', which is similar to the buck current 34 shown in FIG. 1B. A waveform $I'_{L2}$ represents an output current at the output inductor 124', which has significant current ripple due to the significant AC ripple of the total laser voltage $V'_{Total}$. A waveform $V'_{buck}$ represents a switching buck voltage from the power source 113', before the buck inductor 120'. A waveform $V'_{L6}$ represents a single laser voltage measured at a node 115, which indicates a voltage applied to the single laser 114'$f$. A waveform $V'_{Total}$ represents the total laser voltage, which may be measured at a voltage out node 117. FIG. 4B shows that, in the simultaneous current pulsing operation, the total laser voltage $V'_{Total}$ is about six times larger than the individual laser voltage $V'_{L6}$, which contributes to the increased AC current ripple in the output current $I'_{L2}$.

FIG. 4C shows the simulation results shown in FIG. 4B and the simulation results of the phased current pulsing operation. A waveform $I''_{L1}$ represents a buck current from the buck inductor 120' in the phased current pulsing operation, which is substantially identical to the buck current $I'_{L1}$ from the simultaneous current pulsing operation. Also, a buck voltage $V''_{buck}$ and a single laser voltage $V''_{L6}$ in the phased current pulsing operation are substantially identical to the buck voltage $V'_{buck}$ and the single laser voltage $V'_{L6}$ in the simultaneous current pulsing operation. However, in the phased current pulsing operation, the total voltage $V'''_{Total}$ is averaged out and substantially reduced, with substantially reduced AC ripple (which relates to the reduced ripple current in the output inductor 124'), compared to the total voltage $V'_{Total}$ from the simultaneous current pulsing operation. Further, an output current $I''_{L2}$ at the output inductor 124' has significantly reduced AC current ripple in the phased current pulsing operation. The output currents $I'_{L2}$, $I''_{L2}$ and the total laser voltages $V'_{Total}$, $V''_{Total}$ are also separately shown in FIG. 4D for comparison.

Accordingly, in the phased current pulsing operation, the voltage ripple of the total laser voltage $V'''_{Total}$ may be significantly reduced, which may lead to lowering the current ripple in the output current $I''_2$. Thus, the phased current pulsing operation may be carried out without increasing the value and size of the output filter. In fact, more lasers connected in series may enable to use a smaller output filter with a decreased value. Also, the phased current pulsing operation may be carried out using smaller and less expensive output magnetics to handle the total laser voltage $V'''_{Total}$. Therefore, the device size and manufacturing cost may be reduced. Also, since each output switch 126" may need to handle only one laser voltage, the output switches 126" may perform faster transitions at a higher switching rate, and switch only internal stray inductance of the laser package, without switching parasitic stray inductances of the connections between the lasers 114 in series. Further, since each of the output switches 114" handles only a fraction of the total voltage $V'_{Total}$ at each period between two consecutive phases, while being out of phase with other switches 114", the EMI amplitude may be substantially decreased and spread over a wider frequency spectrum. Furthermore, smaller voltage ratings may be used for the switches 126', making them less costly and more efficient.

According to another embodiment of the invention, multiple lasers with different wavelengths and/or power ratings may be connected in series and controlled differently. Only the amplitude of the pulsed current would be the same since they are connected in series, but the lasers with different wavelengths may be individually controlled by individual duty cycles of the related switches 126' for the appropriate output spectrum while still benefiting the decreased current ripple in the output filter with reduced size and cost. Further, a single driver can be used for a complete RGB system, a system with even more wavelengths, and the like, while adjusting different averaged currents and power for each individual laser connected in series.

The current pulsing operations of the invention may be used in any light source applications, such as, e.g., medical devices, for example, endoscopy light sources, and the like, image projectors, televisions, computer monitors, photography light sources, pulsing light sources, microscopy, infrared and near-IR applications, heating applications, industrial curing applications, welding and the like. Further, according to another embodiment of the invention, the current pulsing operations of the invention may also be used for other applications, such as, e.g., thermoelectric (TE) coolers, for example, Peltier cooler, and the like. For example, a single current source may drive multiple TE coolers or other loads connected in series. Each TE cooler may be switched with different duty cycles according to the individual temperature regulation, but all TE coolers may be phased appropriately to lower the current ripple in the output filter, which may also lead to reduction in output filter size and manufacturing cost. Also, in an embodiment of the invention, the randomly phased current pulsing operation may be used for a large number of TE elements connected in series, which may reduce the AC current ripple and allow to use a smaller and less expensive output filter.

The embodiments of the current pulsing operations described above with reference to FIGS. 1B, 1C, 3B, 4B, 4C and 4D may be carried out by, for example, an automated mechanism, such as, e.g., a machine, a robot, a person, or the like, which operates under the control of, e.g., a computer (not shown). For example, a computer program may be provided on a computer-readable medium, which may be executed on the computer to carry out providing a pulsed current to multiple lasers in the various current pulsing operations described above. The computer program may be provided on a computer readable medium.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

We claim:
1. A laser device, comprising:
   a drive circuit; and
   a plurality of lasers that are electrically connected in series relative to the drive circuit;
   wherein the drive circuit is configured to apply a current to the plurality of lasers having a plurality of phases;
   wherein the drive circuit supplies a constant current to the plurality of lasers that are electrically connected in series;
   wherein the drive circuit comprises:
      a converter comprising a first inductor and one or more output capacitors;
      an output inductor coupled in series between an output of the converter and the plurality of lasers;
      wherein the output inductor receives output of the converter;

wherein the laser device further comprises an individual switch in parallel with each laser of the plurality of lasers such that current supplied by the drive circuit can be made to bypass each laser of the plurality of lasers independently; and wherein the laser device further comprises a switch controller configured to produce a light pulse by phasing off in time a multiple of the individual switches, thereby creating smaller voltage steps in the output inductor than the voltage steps created by actuating off all of the plurality of lasers at once.

2. The laser device of claim 1, wherein each of the plurality of lasers has a substantially same wavelength as other lasers of the plurality of lasers.

3. The laser device of claim 1, wherein the plurality of lasers comprises a first laser provided at a first phase and a second laser provided at a second phase, wherein the first phase and the second phase are different, and wherein a phase difference between the first and second phases is calculated from dividing the pulse period by a number of lasers connected in series.

4. The laser device of claim 3, wherein the pulse period is 360 degrees.

5. The laser device of claim 3, wherein a total voltage provided to the plurality of lasers during a period between the first and second phases is smaller than a sum of individual voltages provided to the plurality of lasers, respectively, during a pulse period of the pulsed current;

wherein current ripple in output current from the output inductor is reduced by the smaller total voltage applied to the plurality of lasers.

6. The laser device of claim 1, wherein the drive circuit is further configured to apply the pulsed current to each laser at a random phase.

7. The laser device of claim 1, wherein the drive circuit comprises a plurality of output switches connected to the plurality of lasers, respectively, such that there is one-to-one correspondence between each of the plurality of output switches and each of the plurality of lasers to provide the pulsed current to each laser at a different phase.

8. The laser device of claim 1, wherein at least one of the plurality of lasers has a different wavelength from other lasers of the plurality of lasers.

9. A method of driving a plurality of lasers, the method comprising:

applying a current with a drive circuit to a plurality of lasers having a plurality of phases, wherein the plurality of lasers are electrically connected in series relative to the drive circuit;

wherein the drive circuit comprises:
a converter comprising a first inductor and one or more output capacitors;
an output inductor coupled in series between an output of the converter and the plurality of lasers;
wherein the output inductor receives output of the converter;

supplying, using the driver circuit, a constant current to the plurality of lasers, wherein each laser of the plurality of lasers corresponds to an individual switch in parallel with each of the lasers; and interrupting, using a switch controller, the constant current supplied by the drive circuit to each laser of the plurality of lasers independently to produce a light pulse, by phasing off in time a multiple of the individual switches, thereby creating smaller voltage steps in the output inductor than the voltage steps created by actuating off all of the plurality of lasers at once.

10. The method of claim 9, wherein the method further comprises:

providing a pulsed current to a first laser at a first phase; and
providing the pulsed current to a second laser at a second phase, wherein the first phase and the second phase are different;

wherein a total voltage provided to the plurality of lasers during a period between the first and second phases is smaller than a sum of individual voltages provided to the plurality of lasers, respectively, during a pulse period of the pulsed current;

wherein a phase difference between the first and second phases is calculated by dividing the pulse period by a number of lasers connected in series.

11. The method of claim 10, wherein the pulse period is 360 degrees.

12. The method of claim 9, wherein each of the plurality of lasers has a substantially same wavelength as other lasers of the plurality of lasers.

13. The method of claim 9, wherein at least one of the plurality of lasers has a different wavelength from other lasers of the plurality of lasers.

14. A non-transitory computer readable storage medium having a stored computer program embodying instructions, which, when executed by a computer, cause the computer to drive a plurality of lasers, the computer readable medium comprising:

instructions for applying a current with a drive circuit to a plurality of lasers having a plurality of phases, wherein the plurality of lasers are electrically connected in series relative to the drive circuit;

wherein the drive circuit comprises:
a converter comprising a first inductor and one or more output capacitors;
an output inductor coupled in series between an output of the converter and the plurality of lasers;
wherein the output inductor receives output of the converter;

instructions for supplying a constant current by the drive circuit to the plurality of lasers, wherein each laser of the plurality of lasers corresponds to an individual switch in parallel with each of the lasers; and instructions for interrupting, using a switch controller, the constant current supplied by the drive circuit to each laser of the plurality of lasers independently to produce a light pulse, by phasing off in time a multiple of the individual switches, thereby creating smaller voltage steps in the output inductor than the voltage steps created by actuating off all of the plurality of lasers at once.

15. The non-transitory computer readable storage medium of claim 14, further comprising:

instructions for providing a pulsed current to a first laser at a first phase; and
instructions for providing the pulsed current to a second laser at a second phase, wherein the first phase and the second phase are different;

wherein a total voltage provided to the plurality of lasers during a period between the first and second phases is smaller than a sum of individual voltages provided to the plurality of lasers, respectively, during a pulse period of the pulsed current;

wherein a phase difference between the first and second phases is calculated by dividing the pulse period by a number of the lasers connected in series.

16. The non-transitory computer readable storage medium of claim 15, wherein the pulse period is 360 degrees.

17. The non-transitory computer readable storage medium of claim 14, wherein each of the plurality of lasers has a substantially same wavelength as other lasers of the plurality of lasers.

18. The non-transitory computer readable storage medium of claim 14, wherein at least one of the plurality of lasers has a different wavelength from other lasers of the plurality of lasers.

* * * * *